United States Patent [19]

Raffel et al.

[11] 4,283,235
[45] Aug. 11, 1981

[54] DIELECTRIC ISOLATION USING SHALLOW OXIDE AND POLYCRYSTALLINE SILICON UTILIZING SELECTIVE OXIDATION

[75] Inventors: Jack I. Raffel, Lexington; Stephen E. Bernacki, Worcester, both of Mass.

[73] Assignee: Massachusetts Institute of Technology, Cambridge, Mass.

[21] Appl. No.: 150,067

[22] Filed: May 15, 1980

Related U.S. Application Data

[60] Division of Ser. No. 61,374, Jul. 27, 1979, Pat. No. 4,231,819, which is a division of Ser. No. 773,637, Feb. 28, 1977, Pat. No. 4,184,172, which is a continuation-in-part of Ser. No. 747,743, Dec. 6, 1976, abandoned.

[51] Int. Cl.³ .................. H01L 21/20; H01L 21/302; H01L 21/76
[52] U.S. Cl. ...................... 148/175; 29/578; 29/580; 148/1.5; 148/174; 148/187; 156/612; 156/647; 156/657; 357/49; 357/50; 357/55; 357/59
[58] Field of Search ................. 148/1.5, 174, 175; 29/578, 580; 156/612, 647, 657; 357/49, 50, 55, 59

[56] References Cited

U.S. PATENT DOCUMENTS

| | | | |
|---|---|---|---|
| 3,386,865 | 6/1968 | Doo | 148/175 |
| 3,698,947 | 10/1972 | Kemlage et al. | 148/174 X |
| 3,730,765 | 5/1973 | Stein | 148/174 X |
| 3,736,193 | 5/1973 | Tucker et al. | 148/175 |
| 3,791,882 | 2/1974 | Ogiue | 148/174 |
| 3,871,007 | 3/1975 | Wakamiya et al. | 357/49 |
| 3,947,299 | 3/1976 | Weijland et al. | 148/175 X |
| 4,009,484 | 2/1977 | Ogiue et al. | 357/50 X |
| 4,016,596 | 4/1977 | Magoo et al. | 357/49 X |

*Primary Examiner*—R. Dean
*Assistant Examiner*—W. G. Saba
*Attorney, Agent, or Firm*—Arthur A. Smith, Jr.; Gary A. Walpert

[57] ABSTRACT

A process is described which combine polycrystalline isolation of collectors and shallow oxide isolation of bases. This approach is capable of providing deep dielectric isolation, surface planarity and the high density of walled emitter geometries, a combination heretofore unobtainable by any other means.

This isolation scheme has been used to fabricate ECL gate chains. The transistors were located in 2.5 micron thick n epi islands surrounded by $5 \times 10^5$ ohm-cm polysilicon selectively oxidized with silicon nitride masking to a thickness of one micron. The oxide "bump" at the nitride mask was typically 3000 Å and the epi-poly step height was as small as 2600 Å. The circuits have polysilicon resistors and were fabricated using both thermal diffusion and ion implantation. The power-delay product of these circuits was approximately one-half that of junction isolated circuits.

7 Claims, 13 Drawing Figures

DIELECTRIC ISOLATION USING SHALLOW OXIDE AND POLYCRYSTALLINE SILICON UTILIZING SELECTIVE OXIDATION

The Government has rights in this invention pursuant to Contract No. AF19(628)-76-C-0002 awarded by the Department of the Air Force.

This is a division of application Ser. No. 061,374, filed July 27, 1979 now U.S. Pat. No. 4,231,819; which is a division of application Ser. No. 773,637, filed Feb. 28, 1977, now U.S. Pat. No. 4,184,172; which is a continuation-in-part of application Ser. No. 747,743, filed Dec. 6, 1976, now abandoned.

BACKGROUND OF THE INVENTION

This invention relates to isolation of semiconductor integrated circuit devices and in particular of isolation of integrated circuit transistors by a combination of polysilicon and oxide isolation.

Techniques for achieving dielectric isolation usually require a compromise between surface planarity and isolation depth, which is ultimately reflected in a trade off between photolithographic resolution and device impurity profiles. For example, deep oxide moats which penetrate epi-collectors to the underlying substrate require long, high-temperature oxidations resulting in buried-collector out-diffusion which limits the minimum tolerable epi thickness. The lateral growth of selectively grown oxide at the interface with the $Si_3N_4$ mask lifts the mask at the interface which severely affects surface planarity and degrades lithographic definition. Deep oxide isolation is further complicated by the push-ahead of epi-collector impurities which can lead to a breech in the isolation at the intersection of the oxide and the underlying substrate. Various techniques have been developed for overcoming this problem by combining junction isolation with oxide isolation using "reach down" and "reach up" diffusion at the oxide-substrate interface, at the cost of further processing complexity.

In an attempt to eliminate deep oxidations and thus minimize these problems a technique was developed by M. L. Naiman, *Electrical Society Meeting*, San Francisco, Calif., May 1974, for growing high-resistance polysilicon isolation simultaneously with n-type epi growth by introducing a thin oxide spoiler layer under poly isolation regions. The resulting structure provides the desired dielectric isolation, eliminates high-temperature processing and achieves good planarity. However, it cannot be used in the space-saving walled-emitter geometry where isolation oxide impinges directly on the emitter diffusion because enhanced diffusion in the poly leads to emitter-collector shorting. Thus one of the major advantages of dielectric isolation is severely compromised.

SUMMARY OF THE INVENTION

In order to overcome these deficiencies in the prior art, the "poly-ox" process has been developed, in which polysilicon is used to provide collector isolation while a relatively shallow oxide is used to isolate bases, thus providing the combined advantages of both techniques. An embodiment of the invention is shown in cross section in FIG. 1(c) along with conventional junction-isolation in FIG. 1(a) and oxide-isolation in FIG. 1(b) for transistors.

The oxide thickness need only be slightly greater than the base depth or about 7000 Å for devices made according to this invention rather than the 2.5 to 4 microns required to fully penetrate the collector.

It is an object of this invention to provide a method and device where the transistor area is greatly reduced by allowing the base and emitter to be in contact with the silicon dioxide which forms the upper layer of dielectric isolation and by reducing the height of the oxide bump at the boundary of the oxide and the transistor.

It is a further object of this invention to produce a transistor having reduced collector-isolation and base-collector capacitance, thereby contributing to a reduced power-delay product, a significant measure of digital logic performance.

It is a feature of this invention that the top surface of the silicon dioxide is approximately co-planar with the top surface of the epitaxial silicon islands.

It is a further feature of this invention that the bottom surface of the silicon dioxide layer is below the level of junctions in the epitaxial silicon islands.

It is a still further feature of this invention that the junction in the epitaxial silicon islands can extend out to the silicon dioxide layer thereby reducing the junction capacitance.

Other objects and features will become apparent from the following description of the invention read in conjunction with the figures in which.

FIG. 2(a)–2(i) show some of the steps in the method of fabrication of the transistor of this invention.

Figure 1A:
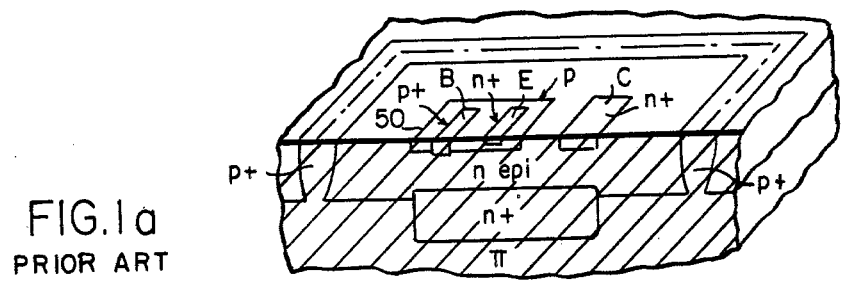
FIG. 1(a) is a cross-section view of a transistor with junction isolation.
Figure 1B:
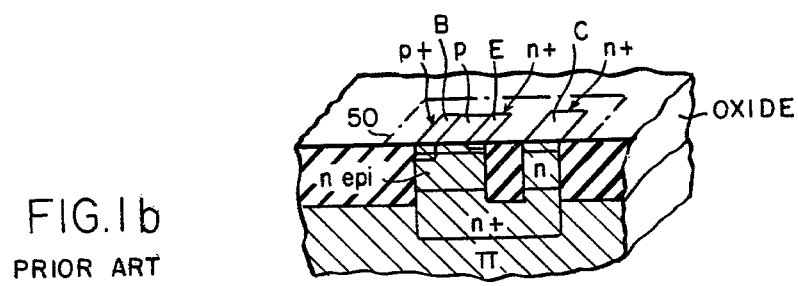
FIG. 1(b) is a cross-sectional view of a transistor with isoplanar (deep-oxide) isolation.
Figure 1C:
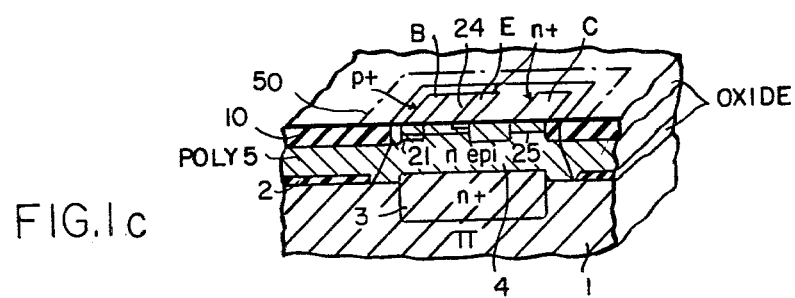
FIG. 1(c) is a cross-sectional view of a preferred embodiment of the transistor of this invention using "poly-ox" isolation.
Figure 2:
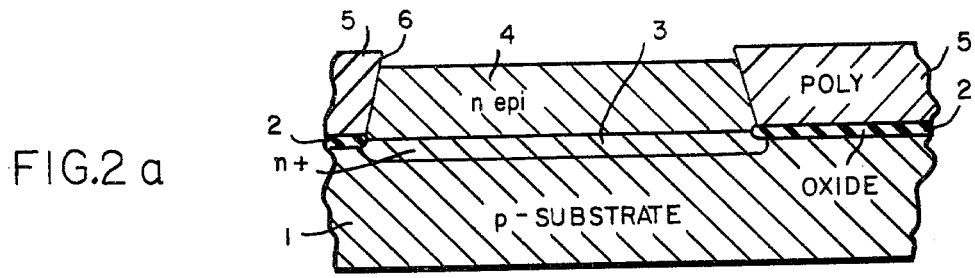
Figure 2:
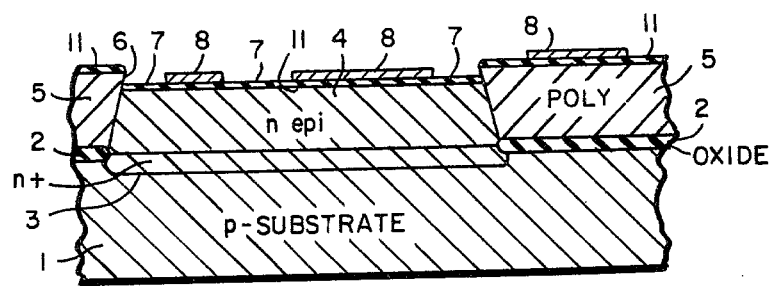
Figure 2:
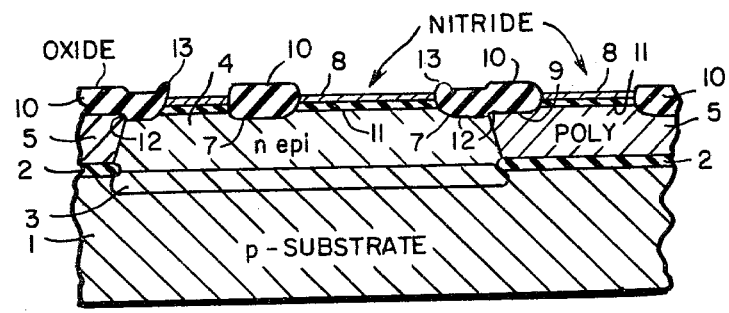
Figure 2:
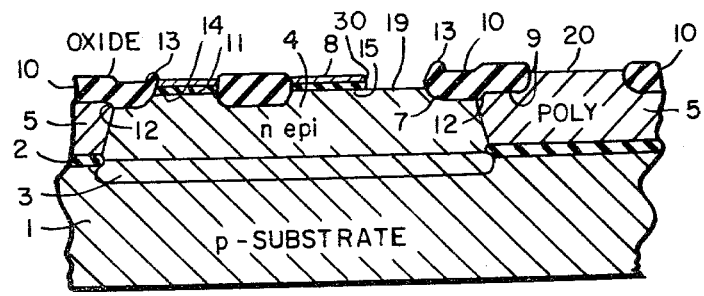
Figure 2:
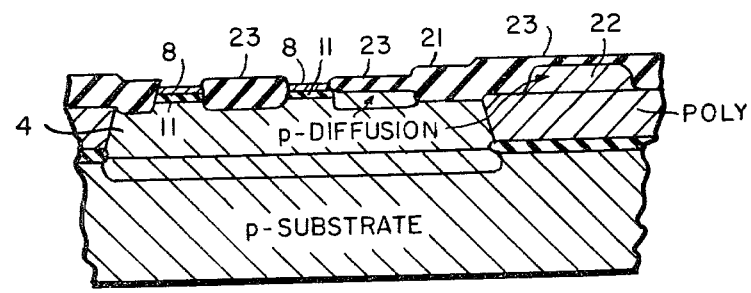
Figure 2:
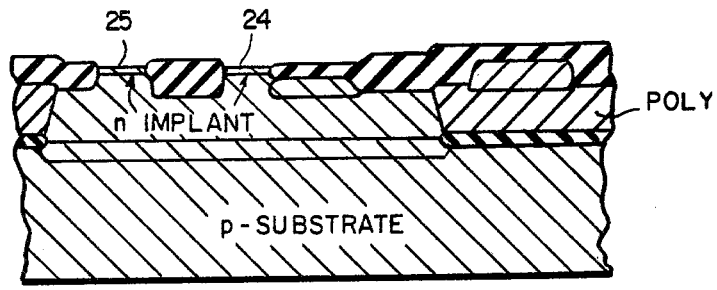
Figure 2:
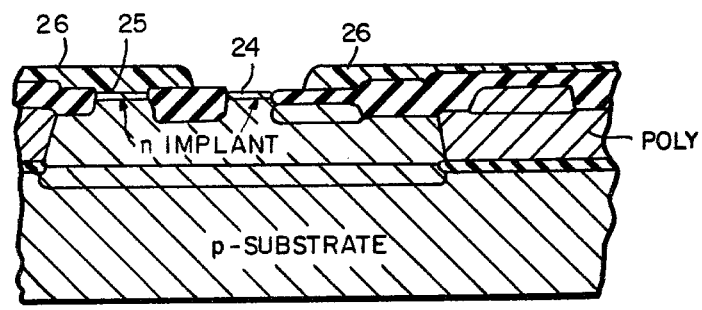
Figure 2:
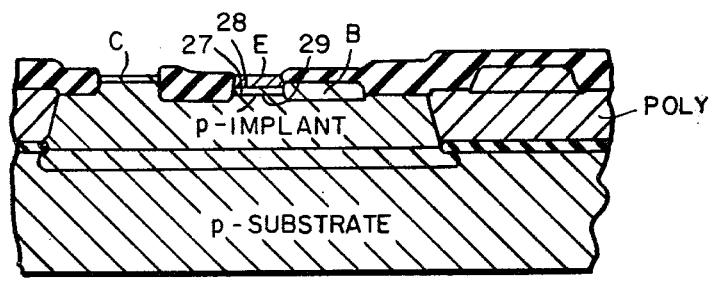
Figure 2:
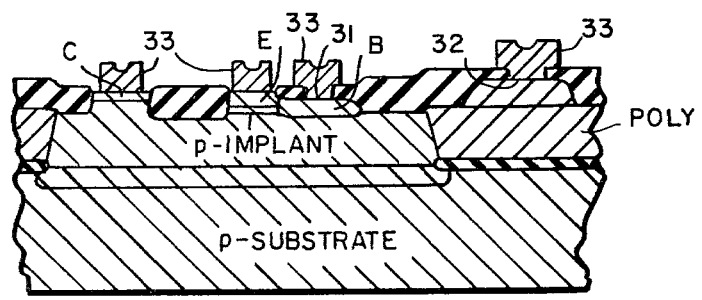
Figure 3:
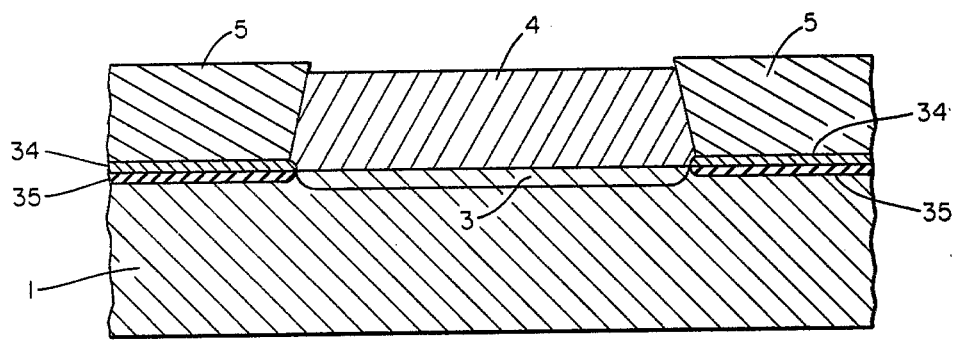

FIG. 3 is a cross-sectional view of another embodiment of this invention corresponding to the structure of FIG. 2(a).

DESCRIPTION OF SPECIFIC EMBODIMENT

The process sequence for making the transistor of this invention is illustrated in FIGS. 2(a)–2(i). The starting substrate 1 is a 20–40 Ω-cm p-type <111> silicon substrate oxidized to form 5000 Å of silicon dioxide 2 (hereinafter referred to as oxide). A buried-collector photoresist mask (not shown) is followed by an oxide etch which defines the oxide 2 openings for a spin-on arsenic buried collector 3. After drive-in of the collector 3 the masking oxide 2 is thinned to a thickness of 1000 Å by a timed buffered HF etch. Silane is used to deposit 2.5 microns of epitaxial silicon 4 (0.5 Ω-cm n-type) over the buried collector 3 while simultaneously depositing ~2.7 microns of polysilicon 5 (5×10$^5$ Ω-cm) over the oxide 2, resulting in an epi-poly step 6 height of ~3000 Å. This structure is shown in FIG. 2(a).

Although not included in the present process, this epipoly step height 6 could be reduced or nearly eliminated by the extra step of using nitride masking techniques to recess the nucleating oxide 2 below the level of the buried-collector silicon surface. This is accomplished by initially depositing a silicon nitride layer on a 500 Å layer of silicon dioxide. The dioxide protects the silicon from the nitride. Next, the nitride and dioxide are masked and etched by conventional procedures on all regions except where a buried collector is desired.

The exposed surface of the substrate 1 is subjected to an isotropic silicon etch of conventional type, for example, an etching solution of 100 parts nitric acid and one part hydrofluoric acid. The depth of the etching is such that the different growth rates of the epitaxial 4 and polycrystalline 5 silicon layers is compensated for thereby reducing the step height 6 below that obtained by the process described in the preceding paragraph. The nitride which is over the collector acts as a selective oxidation mask for the deposition of the oxide layer 2. The nitride and dioxide mask is then stripped by conventional processes to leave the exposed region of silicon in which the buried collector 3 is driven in. At this point, process of depositing the epitaxial 4 and polycrystalline 5 as recited above results in the structure shown in FIG. 2(a), except that the height of the polycrystalline region 5 is the same as the height of the epitaxial region 4.

Next, a 500 Å silicon dioxide layer 11 is grown to protect the silicon surface of regions 4, 5, and then 800 Å of silicon nitride 8 is deposited. Photoresist (not shown) is patterned with a second mask which defines areas to be transistors or resistors, and the nitride layer 8 etched in a radial-flow plasma chamber using only the resist as a mask. The area of the mask for the transistors is smaller than the area of the epitaxial silicon layer 4 to leave a region 7 of silicon layer 4 uncovered by nitride 8. The unmasked $SiO_2$ 11 is then etched in a buffered HF solution to expose region 7 of the epitaxial silicon 4 and the adjacent region 9 of the polysilicon region 5, as shown in FIG. 2(b). The silicon regions 7, 9 are isotropically etched to a depth of 0.5 microns. One micron of silicon dioxide 10 is thermally grown at 1000° C. for 4 hours in steam, resulting in the structure of FIG. 2(c). The 0.5 micron silicon etch and the one micron oxidation thickness results in the surface of the oxide 10 being approximately planar with the surface of nitride 8.

The surface topography at this time in the processing as measured by a profileometer recording of the surface, reveals a 3000 Å epi-poly step 12 and a 3500 Å oxide bump 13 at the edge of the nitride mask. This topography is quite acceptable for photolithography down to 0.1 mil linewidths.

The next conventional masking and etching step leaves nitride only in the collector 14 and emitter 15 contact areas, as shown in FIG. 2(d). Since these areas are surrounded on all but one side by the field oxide 10, as shown in FIG. 2(d), and since the plasma etches the nitride selectively, this mask can be oversized and alignment is not critical except at edge 30, which defines the emitter width.

Boron is deposited from a boron nitride source and driven in to 1000 Ω/□ ($x_j$=0.3 μm) in the epitaxial layer 4 under region 19 to produce inactive base region 21 and in the polysilicon layer 5 under region 20 to produce resistor 22, as shown in FIG. 2(e). The drive-in is done in an oxidizing ambient thereby growing 2000 Å of silicon dioxide 23 and giving the structure of FIG. 2(e).

Next, the nitride 8 is stripped in hot phosphoric acid and the silicon dioxide 11 is etched in buffered HF, and arsenic implanted at 25 kV to a dose of $1 \times 10^{16}$ atoms/cm$^2$ in a direction 7° from the <111> normal; the various oxides serving as a mask everywhere except at the emitter 24 and the collector 25, as shown in FIG. 2(f). The wafer is then coated with 2.3 μm of resist 26 and the base exposed in the next oversized, non-critical masking step, FIG. 2(g). Boron 27 is implanted at 150 keV to a dose of $1 \times 10^{13}$ atoms/cm$^2$, 7° from the <111> normal. The resist 26 is stripped and the implantation damage annealed at 500° C. for 60 minutes under nitrogen. Next, the implanted species is activated and driven in with a 950° C., 15-minute oxygen heat treatment giving an emitter-base junction 28 depth of ~0.2 microns and a base-collector junction 29 depth of ~0.7 microns. This structure is shown in FIG. 2(h). Finally, the base 31 and resistor 32 contact cuts are masked and etched and first level metal 33 (91.5%, Al-2.5% Si-6% CU) deposited and etched to make electrical contact to the base B, collector C, and emitter E, as shown in FIG. 2(i). A 5000 Å thick layer of glass (not shown) is deposited, vias etched, and a second level of pure aluminum deposited and patterned (not shown) completing the processing. It should be noted that the preceding processing sequence includes many conventional processing techniques which are well-known to those skilled in the art and that details as to these steps have been omitted.

The transistors made by the method of this invention were fabricated to form an emitter-coupled-logic gate chain. Each gate consisted of five n-p-n transistors and associated resistors. No attempt was made to reduce metallization lengths from those used in junction isolated chains which were also fabricated and compared for electrical performance with the "poly-ox" chain. Calculations on individual transistors using 0.1 mil×0.3 mil emitter stripes indicate the following reduction in circuit capacitance:

1—Resistor capacitance: 0.46
2—Wiring capacitance: 0.27
3—Collector-isolation capacitance: 0.05
4—Base-collector capacitance: 0.54

The power-delay product of the gate circuits using transistors made according to this invention was approximately one-half that of junction isolated circuits.

The principal difficulty in achieving a high-yield, reproducible, process arises from a tendency for the base dopant at the oxide isolation interface to segregate into the oxide producing a low concentration which easily inverts and shorts the emitter to the collector. This problem is aggravated by the use of a low base dopant concentration and in thermal diffusion processing by the further attenuation in the distribution in the tail-off across the base width. By ion implanting the base, a more uniform concentration is maintained throughout the active base width. Further, since the base is implanted last there is little subsequent high-temperature processing to cause segregation into the isolation oxide. Using this technique consistent transistor yields have been obtained on test wafers. Delays of 0.69 nsec per stage were obtained with these devices running at 0.59 mA instead of the usual 1 mA used for equivalent speed junction-isolated chains. This improvement of approximately a factor of two in power-delay product is only indicative of potential power-delay improvements.

The polysilicon regions 5 have been described earlier as grown on oxide regions 2 which are defined by a buried collector mask followed by etching. When the oxide layer 2 is grown by the thermal process, there is the posibility that the surface of the 20–40 ohm-cm p-type substrate will invert to an n-type layer and thereby electrically connect the n-type buried collector layers 3 to each other, which is not desired. The possibility of inversion is greatest when the impurity concentration of the substrate is low (20–40 ohm-cm) and high temperature processing is used to deposit the layer of oxide 2.

There are a number of ways to minimize the possibility of inversion and thereby to consistently fabricate useful devices. One way is to cause the surface of the substrate 1 to be more strongly p-type by implanting or diffusing a p-type dopant into the surface of the starting substrate before the oxide is thermally grown. Alternatively, the implantation of the p-type doping is done through the thermally grown oxide 2 into the surface of the silicon before the buried collector 3 regions are etched through the oxide.

If it is not desired to change the concentration of the p-type dopant in the surface of the substrate, the inversion possibility produced by the thermally grown oxide layer 2 may be reduced by using one of the following procedures:

(a) a layer of 800 Å of silicon nitride 34 deposited by chemical vapor deposition techniques over 300 Å oxide 35 thermally grown onto the silicon surface.

(b) a 2000–5000 Å layer of silicon dioxide 2 deposited by chemical vapor deposition techniques at temperatures lower than that required for thermal oxide growth.

(c) a 2000–5000 Å layer of silicon dioxide 2 deposited by a spin-on glass technique.

(d) a layer of, or any combination of layers of, silicon dioxide 35 or silicon nitride 34 deposited by sputtering or evaporation techniques.

(e) the layer 2 of FIG. 2(a) is caused to be a layer of amorphous silicon deposited by conventional sputtering or evaporation techniques. As in the case of the thermally grown oxide layer 2, the following steps are the masking and etching of these alternative spoiler layers by conventional techniques to form the regions of exposed silicon for the buried collector 3.

(f) In general an amorphous or polycrystalline electrically insulating material will be adequate for layer 2 provided it can withstand the subsequent processing steps of device fabrication and does not require high temperatures for its formation.

Although the invention has been described in detail in the fabrication of a bi-polar transistor, it should be recognized that the invention should not be limited to this device. Another example of a device in which the invention may be applied is MOS or CMOS transistors. In these devices, the isolating layer of $SiO_2$ should extend down below the source-substrate and drain-substrate junctions to provide good isolation and to reduce the source and drain capacitance. Other applications of the isolation principle contained in this invention will be apparent to those skilled in the art.

What is claimed is:

1. A method for achieving isolation of integrated circuits comprising:
   depositing a layer of oxide on a silicon substrate leaving open areas on which devices are to be subsequently made over the exposed silicon substrate,
   growing simultaneously a layer of polycrystalline silicon on the oxide regions and a layer of epitaxial silicon on the exposed silicon regions of the substrate.
   selectively forming a thick oxide layer on the surface of said polycrystalline and said epitaxial silicon layers leaving open those regions of the polycrystalline layer where resistors are to be made and those regions of the epitaxial silicon where junction devices are to be made,
   the thickness of the oxide being such that the bottom of the oxide extends below the junction depth of junctions to be subsequently formed in said epitaxial silicon open regions and less than the thickness of the epitaxial layer, and
   forming said junction devices in said epitaxial layer open regions,
   at least one junction abutting the thick oxide layer beneath the surface of the epitaxial silicon,
   whereby said oxide forms an oxide isolation between the junctions and said polysilicon layer surrounding the epitaxial silicon.

2. A method for achieving isolation of the silicon islands of integrated circuits comprising:
   forming a first layer of oxide on a silicon substrate,
   etching away areas of this oxide to form an oxide mask leaving open areas on which devices are to be subsequently made over the exposed silicon substrate,
   forming buried collectors in such etched areas,
   thinning said oxide mask,
   simultaneously growing epitaxial silicon islands on said exposed silicon and polycrystalline silicon on said oxide,
   depositing a layer of silicon nitride and masking and etching said layer of silicon nitride leaving unmasked the portions of said islands contiguous to said polysilicon surface and also any region of said island to be used for oxide isolation between impurity junctions.
   etching the exposed silicon to a predetermined depth,
   oxidizing the exposed silicon, the depth of said silicon etching and the thickness of said oxide being such that the top of said oxide is substantially co-planar with the top surface of the masked silicon islands and the bottom of the oxide extends below the junction depth of junctions to be subsequently formed in said epitaxial silicon islands,
   removing said silicon nitride mask on the surface of the silicon islands to provide an exposed epitaxial silicon surface,
   forming junction devices in said island surfaces.

3. The method of claim 2 wherein said initial layer of oxide is masked with a photoresist mask leaving openings corresponding to the buried collector regions of devices,
   the oxide is etched down to the silicon substrate,
   the photoresist mask is removed leaving a corresponding oxide mask which defines the buried collector regions,
   the impurity for the burial collector is driven in,
   the oxide mask is then etched to thin it prior to the step of simultaneously growing the epitaxial and polycrystalline layer.

4. The method of claim 2 wherein said silicon substrate is prepared for the initial growth of oxide by implanting or diffusing a p-type dopant into the surface of the substrate prior to the growth of the first oxide layer to increase the impurity concentration of the surface relative to the bulk doping of the substrate.

5. The method of claim 2 comprising in addition implanting a p-type dopant deposit through said first oxide layer into the surface of the substrate prior to etching the layer to increase the impurity concentration of the surface relative to the bulk doping of the substrate.

6. The method of claim 2 wherein said first layer of oxide is a thermally grown layer of sufficient thickness to form a suitable surface on which a silicon nitride layer is chemically deposited and said etching of this oxide also etches the nitride to provide areas of exposed silicon substrate.

7. A method for achieving isolation of the silicon islands of integrated circuits comprising:

depositing a layer of amorphous silicon on a silicon substrate, etching away areas of this amorphous silicon to form an amorphous silicon mask leaving open areas on which devices are to be subsequently made over the exposed silicon substrate, forming buried collectors in such etched areas, simultaneously growing epitaxial silicon islands on said exposed silicon and polycrystalline silicon on said amorphous silicon, depositing a layer of silicon nitride and masking and etching said layer of silicon nitride leaving unmasked the portions of said islands contiguous to said polysilicon surface and also any region of said island to be used for oxide isolation between impurity junctions, etching the exposed silicon to a predetermined depth, oxidizing the exposed silicon, the depth of said silicon etching and the thickness of said oxide being such that the top of said oxide is substantially co-planar with the top surface of the masked silicon islands and the bottom of the oxide extends below the junction depth of junctions to be subsequently formed in said epitaxial silicon islands, removing said silicon nitride mask on the surface of the silicon islands to provide an exposed epitaxial silicon surface, forming junction devices in said island surfaces.

* * * * *